SEMICONDUCTOR DEVICES WITH LOW LEAKAGE CURRENT ACROSS JUNCTION

Filed Jan. 24, 1964

2 Sheets-Sheet 1

WITNESSES:
John G. Chopp
James F. Young

INVENTOR
Hung Chang Lin
BY Gordon H. Telfer
ATTORNEY

Jan. 9, 1968 HUNG CHANG LIN 3,363,152

SEMICONDUCTOR DEVICES WITH LOW LEAKAGE CURRENT ACROSS JUNCTION

Filed Jan. 24, 1964 2 Sheets-Sheet 2

United States Patent Office 3,363,152
Patented Jan. 9, 1968

3,363,152
SEMICONDUCTOR DEVICES WITH LOW LEAKAGE CURRENT ACROSS JUNCTION

Hung Chang Lin, Silver Spring, Md., assignor to Westinghouse Electric Corporation, Pittsburgh, Pa., a corporation of Pennsylvania Filed Jan. 24, 1964, Ser. No. 339,978
8 Claims. (Cl. 317—235)

This invention relates generally to semiconductor devices and, more particularly, to unipolar and bipolar transistors that have an insulating layer for the protection of a junction at the surface that causes an inversion layer to form under the insulating layer.

In most semiconductor devices it is important to minimize the reverse leakage current across a p-n junction. This is particularly true for a unipolar transistor where a low gate current is usually desirable. One cause of leakage current is the existence of an inversion layer (or channel) on the surface of the semiconductor under an insulating layer applied for surface passivation.

It has been observed that an inversion layer of electrons forms under a layer of silicon dioxide in semiconductive materials such as silicon. The exact cause of this inversion layer is not known but it does provide a leakage path across the junction which is highly undesirable.

A further problem with present semiconductor devices is that radiation bombardment may so significantly alter the conductivity of semiconductive material that a device is not suitable for operation. Conditions of high radiation may be encountered in satellites and other space applications where massive shielding of electronic equipment is impractical.

It is therefore an object of the present invention to provide improved semiconductor devices of the type having insulating layers for surface passivation.

Another object is to provide improved semiconductor devices having p-n junctions wherein the leakage current of a junction is minimized.

Another object is to provide improved unipolar transistors with a contact configuration that provides very low leakage current across the gate junction.

Another object is to provide improved bipolar transistors with a contact configuration that improves gain at low currents.

Another object of this invention is to provide an improved semiconductor device with greater capability of withstanding the effects of radiation bombardment.

The invention, in brief, achieves the abovementioned and further objects in a semiconductor device having a surface passivating layer over a p-n junction by providing a contact on top of the passivating layer conductively connected to a contact on the semiconductive material itself that operates at a potential preventing an inversion layer by capacitive interaction through the passivating layer.

In devices passivated by a layer of silicon dioxide, the inversion layer likely to be found is of n-type conductivity, hence it is desirable in the practice of this invention to connect the most negative contact, for example, the drain in an n-on-p field effect structure, to the contact that covers the passivating layer in the junction area. Bipolar transistor structures may also be improved by the practice of this invention. In addition, by employing a radiation resistant contact material disposed over the passivating layer in the vicinity of all junctions of a device, a device not affected by radiation is provided.

The present invention both in its structure and its operation will be better understood with reference to the following description taken in conjunction with the accompanying drawings wherein.

Figure 1:
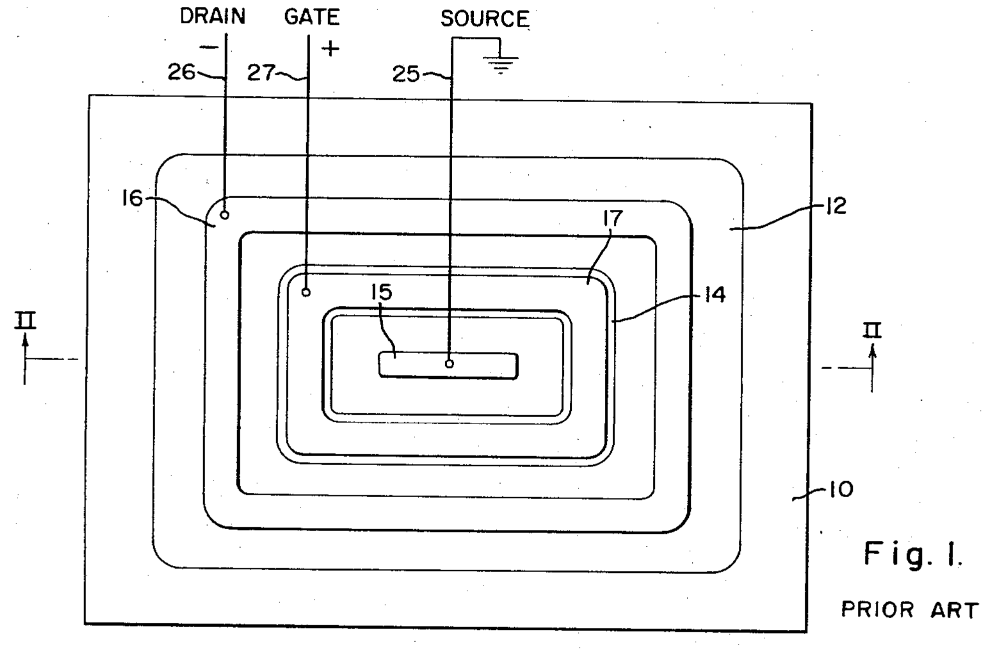
Fig. 1. PRIOR ART
FIGURE 1 is a plan view of a unipolar transistor in accordance with the prior art.

Referring to FIG. 1, there is shown a unipolar transistor comprising a substrate 10 of n-type semiconductive material into which a p-type region 12 has been formed by diffusion. Another n-type region 14 that may also be formed by diffusion and which has a ring-like configuration is disposed in the p-type region 12. Because of its relatively high impurity concentration, the region 14 is designated as being n+. A p-n junction 11 is formed between regions 12 and 14 that terminates at the planar surface 13 of the device. The only contacts for the operation of the device are disposed on the surface 13. The contacts include two ohmic contacts 15 and 16 on the p-type region 12 and an ohmic contact 17 on the n-type region 14. The contacts 15 and 16 to the p-type region serve as source and drain contacts, while the contact 17 to the n-type region 14 serves as a gate contact for the device.

Figure 2:
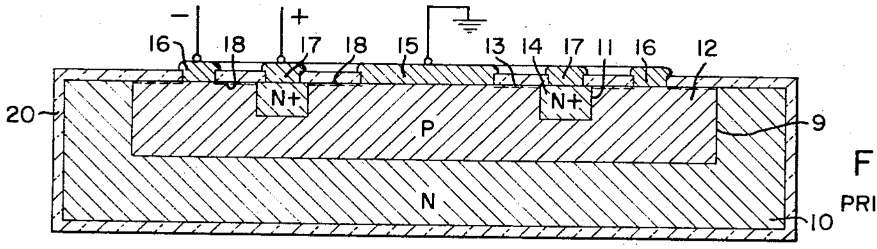
Fig. 2. PRIOR ART
FIG. 2 is a cross-sectional view of the device of FIGURE 1 taken along the line II—II.

FIGS. 1 and 2 illustrate the manner in which the device is operated by providing a difference in potential between the two ohmic contacts 15 and 16. As here shown contact 15 is grounded by means of lead 25 and contact 16 has a negative potential applied thereto by means of lead 26. A potential is applied to the contact 17 by means of lead 27 so as to create a depletion layer at junction 11 to modulate current flow between the ohmic contacts 15 and 16 in the well known manner of field effect transistor operation. The potential to the gate contact 17 is ordinarily equal to or positive with respect to the source potential. FIG. 2 shows a layer 20, omitted in FIG. 1 for clarity, covering the surface of the device except for those positions at which ohmic contacts 15, 16 and 17 are disposed in contact with the semiconductive material. The layer 20 is that known in the art as a passivating layer for protection of the semiconductor material, particularly in the vicinity of p-n junctions, from moisture and other deleterious impurities. It is the case that under such a passivating layer, of a material such as silicon dioxide, what is known as an inversion layer occurs in p-type semiconductivity material constituting a surface layer 18 of electrons in a concentration greater than that of the p-type impurities, so that in effect the entire surface of the p-type region 12 is covered with a thin n-type layer. Consequently, the inversion layer 18 acts as a short circuit across the junction 11 so that when the junction 11 is placed in reverse-bias, its normal operating condition in a unipolar transistor, when it is intended to draw little current, a conductive path exists between the contacts 16 and 17 to the p-type region 12 and the contact 17 to the gate region 14. The leakage current is entirely undesirable in this type of device because its intended applications are those wherein a high impedance is desired. In unipolar devices, a reverse-biased, low-leakage junction 9 is also desired with the substrate 10. The substrate is hence usually connected to the gate contact or by other means maintained at a suitable potential. The inversion layer 18 also adversely affects the characteristics of junction 9.

The reasons for the formation of the inversion layer are not well understood though it is presumed to be as a consequence of some retention of positive charges in the passivating layer 20. The effect has been particularly noted on devices wherein the passivating layer 20 is of silicon dioxide, a commonly used passivating layer that may be formed by thermal oxidation, anodic treatment of the semiconductive surface or deposition. It is also understood that the inversion layer is usually avoided where the surface impurity concentration in the p-type region is high so as to provide a surface resistivity of less than about 0.1 ohm-centimeter, corresponding to an impurity concentration of about $2 \times 10^{17}$ atoms per cubic centimeter. However, it is frequently desirable not to excessively dope the p-type region because of other electrical characteristics such as breakdown voltage or, in the case of simultaneous fabrication of unipolar and bipolar transistors, the current gain.

Besides silicon dioxide it is also known that inversion layers may be created under lead oxide and other passivating materials. It is also possible for an inversion layer of positive charge to occur in n-type material. Hence, in its broad aspects this invention is concerned with avoidance of inversion layers in any semiconductive material having a passivating layer thereon.

The occurrence of inversion layers is frequently unpredictable, that is, in a given fabrication process it is difficult to predict with accuracy whether the fabrication process will create an inversion layer or not. Hence, the practice of the present invention is a means of avoiding an inversion layer by a simple device design which is inexpensive and readily performed and which has no disadvantageous effects if it should be the case that an inversion layer would not occur.

Another disadvantageous aspect of the prior art devices upon which the present invention improves is that the passivating layer 20 while relatively successful in precluding attack of the semiconductor material by atoms of impurities is relatively ineffective in protecting the semi-conductor material from the deleterious effects of radiation bombardment. Such radiation bombardment occurs under the natural conditions encountered in space applications due to cosmic radiation and may also be encountered in certain industrial applications where the device must operate in the vicinity of a reactor.

Figure 3:
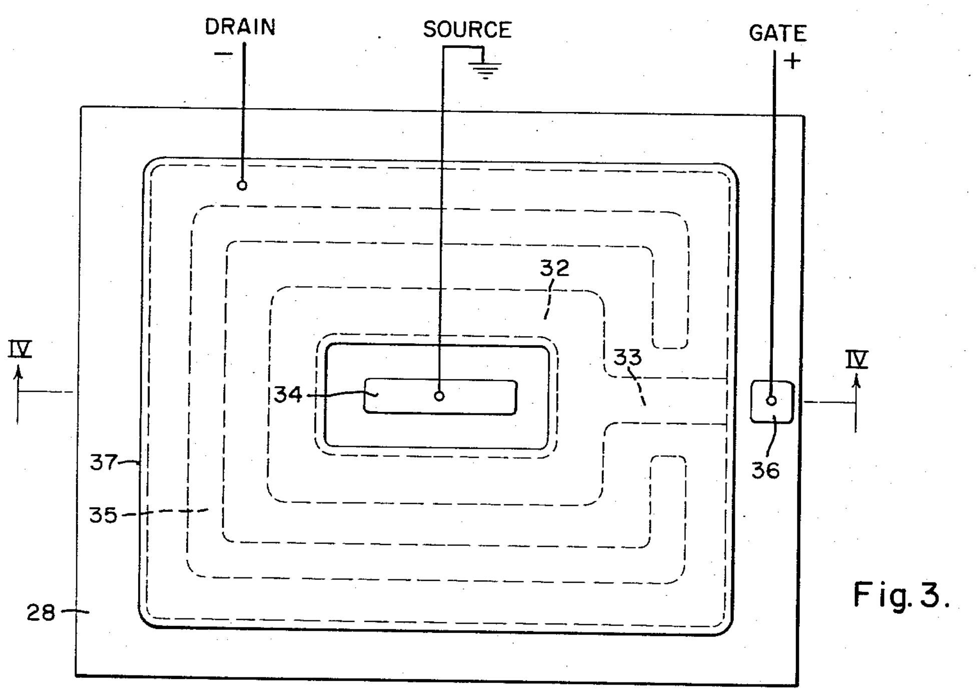
FIG. 3 is a plan view of a unipolar transistor in accordance with the present invention.
Figure 4:
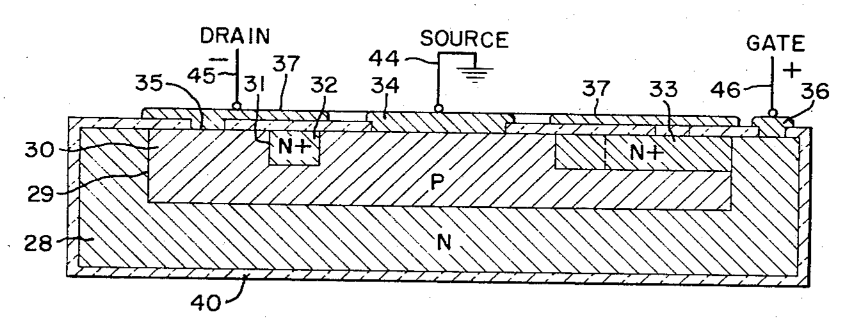
FIG. 4 is a cross-sectional view of the device of FIG. 3 taken along the line IV–IV.

FIGURES 3 and 4 illustrate a device for avoiding the above-mentioned problems of the prior art. The device illustrated is a unipolar transistor comprising an n-type substrate 28 in which p-type region 30 is diffused with an n-type region 32 therein and ohmic contacts 34, 35 and 36 disposed thereon serving, respectively, as source, drain and gate contacts supplied by leads 44, 45 and 46, respectively. The n-type region 32 forms a p-n junction 31 with the region 30. As shown in FIG. 4, a passivating layer 40 covers the semiconductive surface except for those portions to which contacts are made. In the foregoing respects the device is similar to that of FIGS. 1 and 2, however, the device of FIGS. 3 and 4 also includes a conductive member 37 disposed on the surface of the passivating layer 40 over the p-n junction 31 and the p-n junction 29 formed by region 30 with the substrate 28. The conductive member 37 avoids the creation of an inversion layer across the junction 31, in operation, by reason of the application of a negative potential thereto, capacitively coupled to the semiconductive surface and hence driving the accumulated electrons away. In the device shown the conductive member 37 is an integral part of the contact 35, as it may be conveniently so formed and the contact 35 serves as the drain of the unipolar transistor and hence is that to which the most negative potential to the device is applied.

FIGS. 3 and 4 also show an n+ region 33 forming a part of the gate region 32 and connecting it with the substrate 28 to which the contact 36 is applied. Thus, the channel region, p-type region 30, is effectively surrounded by a gate region.

In the illustrative device shown in FIGS. 3 and 4, an extension 37 of the drain contact 35 provides the inversion layer prevention in accordance with this invention. However, the source contact 34 could be similarly employed since it too is more negative than the gate contact 36. It is preferred that the contact carrying the highest potential of the right polarity be used, here that contact is the drain.

The practice of the present invention may be readily carried out by presently known fabrication techniques. For example, in instances in which the contacts to the device are formed by evaporation of metallic material and subsequent alloying it is merely necessary that the conductive member be formed by such operations after the passivating layer 40 is in place. As will be recognized, it is conventional in the fabrication of semiconducor integrated circuits to form the necessary regions in the semiconductive material by diffusion and epitaxial growth techniques and providing an oxide contact mask on the surface with openings therein for the forming of contacts to the semiconductive material. In the same operation in which the contacts are deposited conductive interconnections are disposed over the oxide mask for the purpose of connecting two other elements of the device. At the same time the conductive member 37 for protection of the junction of the unipolar transistor can be provided. It is to be understood that in the practice of this invention a variety of device configurations may be employed with junctions protected from inversion layer formation in the manner of this invention.

The selection of the material for the contact member 37 is not at all critical insofar as the avoidance of the inversion layer is concerned, it merely being necessary that it be conductive. Hence, the use of an aluminum contact member as is conventional in integrated circuit fabrication is suitable. However, for the avoidance of the effects of radiation bombardment, it is desirable to employ a more radiation resistive material such as lead for the contact member. This material such as lead may be applied on top of the contact member of another material such as of aluminum or nickel. It is of course the case that prevention of radiation damage to semiconductive devices may be achieved by a shield surrounding the semiconducting device itself. However, such a solution to the problem requires additional weight and expense in the fabrication of the device that is not encountered by the practice of the present invention. A highly radiation resistant device results if the contact 37 covers each junction and at least a carrier diffusion length on each side of the junction.

Figure 5:
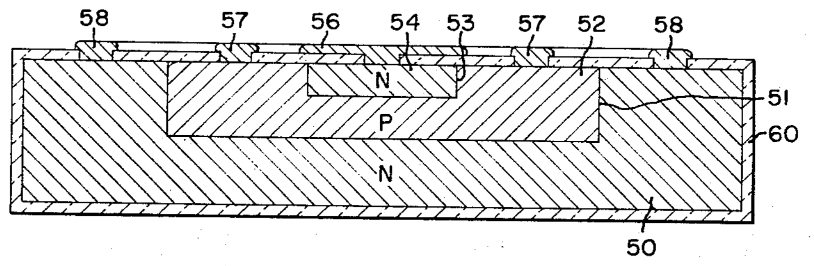
FIG. 5 is a cross-sectional view of a bipolar transistor in accordance with the present invention.

FIGURE 5 shows a bipolar transistor made in accordance with this invention with the purpose being to improve the current gain by avoiding an inversion layer across the emitter to base junction. The device comprises a substrate of n-type material 50 having regions 52 and 54 or alternate semiconductivity type successively disposed therein. P-N junctions 51 and 53 are formed between the regions. Ohmic contacts 56, 57 and 58 are disposed in contact with the regions 54, 52 and 50, respectively, and permit the normal operation of a bipolar transistor. In accordance with this invention the contact to the emitter region 54 has an extended portion which covers the passivating material 60 in the vicinity of the p-n junction 53. In an n-p-n transistor, particularly at low currents, the presence of an inversion layer at the surface of the base region reduces the current gain to a low value due to the shunting effect of the inversion layer. Hence, the avoidance of the inversion layer provides an increased current gain without requiring extensive device redesign.

While the present invention has been described in conjunction with the reduction of leakage current in unipolar transistors and the increased current gain in bipolar transistors, it will be recognized that it has general application for the passivation of any p-n junction. Hence for most efficient device performance whether in single component devices such as those illustrated or in integrated circuitry which may include portions for providing the functions of unipolar transistors, bipolar transistors, diodes, capacitors, resistors and possibly other elements, the device may be designed so that each junction is protected in the manner described by the provision of the conductive member over the passivating layer in the vicinity of the junction, which conductive layer is conductively connected to one of the ohmic contacts to the device that is intended to be operated at a potential which will prevent the creation of an inversion layer.

While the present invention has been shown and described in a few forms only, it will be apparent that various changes and modifications may be made without departing from the spirit and scope thereof.

What is claimed is:

1. A semiconductor device of the field effect type comprising: first, second and third semiconductive regions of, respectively, first, second and second conductivity types with a p-n junction between said first region and each of said second and third regions, said first region underlying and at least substantially surrounding said second region; said third region underlying and surrounding said first region; said junctions terminating at a single planar surface of the device; means conductively interconnecting said second and third regions; first and second ohmic contacts on said surface in contact with said first region to serve as source and drain contacts; said second and third regions having a common electrical connection thereto to serve as a gate contact; a passivating layer of insulating material on said surface and entirely covering at least the termination of said junctions and the adjacent portions of said surface; one of said source and drain contacts having a conductive layer joined therewith that extends over said passivating layer and entirely covers at least the portions of said passivating layer that cover the termination of said junctions and at least a carrier diffusion length on each side of said junctions to avoid the creation of an inversion layer across said junctions.

2. A semiconductor device in accordance with claim 1 wherein: said first, second and third regions are of impurity doped silicon and said passivating layer is of silicon dioxide.

3. A semiconductor device in accordance with claim 2 wherein: said first region is of p-type silicon having a surface impurity concentration of less than about $2 \times 10^{17}$ atoms per cubic centimeter.

4. A semiconductor device in accordance with claim 1 wherein: said conductive layer comprises a material that substantially prevents the bombardment of radiation on said surface at which said junctions terminate.

5. A semiconductor device in accordance with claim 4 wherein: said contacts comprise a material selected from the group consisting of aluminum and nickel and said conductive layer comprises a layer of lead.

6. A semiconductor device in accordance with claim 1 wherein: said means conductively interconnecting said second and third regions comprises material of said second conductivity type that also has a p-n junction between it and said first region whose termination and the surface adjacent it are also covered by said passivating layer and, in turn, by said conductive layer.

7. Electronic apparatus including a semiconductor device in accordance with claim 1 and further comprising: means to establish a potential on said gate contact that reverse biases said junctions; means to establish a potential difference between said source and drain contacts; said drain contact having said conductive layer joined therewith.

8. Electronic apparatus in accordance with claim 7 wherein: said first, second and third regions are, respectively, of p, n and n type conductivity; said source contact is at a positive potential relative to that of said drain contact and said gate contact is at a potential that is at least as much positive with respect to said drain contact as is said source contact.

References Cited

UNITED STATES PATENTS

| | | | |
|---|---|---|---|
| 2,588,254 | 3/1952 | Lark-Horovitz et al. | 317—234 |
| 2,898,477 | 8/1959 | Hoesterey | 317—234 |
| 2,981,877 | 4/1961 | Noyce | 317—235 |
| 3,051,840 | 8/1962 | Davis | 317—234 |
| 3,097,308 | 7/1963 | Wallmark | 317—234 |
| 3,137,796 | 6/1964 | Luscher | 317—234 |
| 3,184,657 | 5/1965 | Moore | 317—235 |

FOREIGN PATENTS

| | | |
|---|---|---|
| 1,361,215 | 6/1964 | France. |
| 998,388 | 7/1965 | Great Britain. |

OTHER REFERENCES

Electronics, "Small Signal Circuit Design," Dec. 6, 1963, by Clark et al. page 50.

Journal of Applied Physics, "Effects of Variation in Surface Potential on Junction Characteristics," by Forester et al., June 1959, vol. 30, No. 6, pp. 906–912.

JOHN W. HUCKERT, *Primary Examiner.*

J. D. CRAIG, *Assistant Examiner.*